(12) United States Patent
Chen et al.

(10) Patent No.: US 10,171,016 B2
(45) Date of Patent: Jan. 1, 2019

(54) MOTOR DRIVING CIRCUIT

(71) Applicant: ANPEC ELECTRONICS CORPORATION, Hsinchu (TW)

(72) Inventors: Kun-Min Chen, Hsinchu (TW); I-Lin Chiu, New Taipei (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 14 days.

(21) Appl. No.: 15/663,659

(22) Filed: Jul. 28, 2017

(65) Prior Publication Data

US 2018/0262135 A1 Sep. 13, 2018

(30) Foreign Application Priority Data

Mar. 13, 2017 (TW) .............................. 106108175 A

(51) Int. Cl.
*H02P 7/285* (2016.01)
*H02P 6/08* (2016.01)
*H02P 6/20* (2016.01)
*H03K 17/0814* (2006.01)

(52) U.S. Cl.
CPC .............. *H02P 7/285* (2013.01); *H02P 6/08* (2013.01); *H02P 6/20* (2013.01); *H03K 17/08146* (2013.01)

(58) Field of Classification Search
CPC ... H02P 7/285; H02P 6/08; H02P 6/20; H03K 17/0814
See application file for complete search history.

(56) References Cited

U.S. PATENT DOCUMENTS

| | | | |
|---|---|---|---|
| 2009/0174372 A1* | 7/2009 | Maeda | G09G 3/3614 320/166 |
| 2009/0243529 A1* | 10/2009 | Lee | H02P 7/285 318/494 |
| 2012/0212251 A1* | 8/2012 | Yanagishima | H03K 17/61 324/762.01 |
| 2017/0302152 A1* | 10/2017 | Watanabe | H02M 1/088 |

* cited by examiner

*Primary Examiner* — Kawing Chan
*Assistant Examiner* — Bradley Brown
(74) *Attorney, Agent, or Firm* — Li & Cai Intellectual Property (USA) Office

(57) ABSTRACT

A motor driving circuit includes a first output switch, a second output switch, a first adjusting module, and a second adjusting module. A rising slew rate of the first output current along the first direction is adjusted according to the first adjusting parameter of the first adjusting module. A falling slew rate of the first output current along the first direction is adjusted according to the second adjusting parameter of the second adjusting module.

14 Claims, 8 Drawing Sheets

MOTOR DRIVING CIRCUIT

BACKGROUND

1. Technical Field

The present disclosure relates to a motor driving circuit, and in particular, to motor driving circuit that linearly adjusts the slew rate of the output current.

2. Description of Related Art

The switching driving circuit of the voice coil motor normally outputs a large output current of 10 mA. It is necessary to adjust the parameters of the drive circuit and output switches for adjusting the slew rate of the output current, such as Gate-Drain capacitance (Cgd). However, the cost of the process is not only increased accordingly, but the changes of the chip parameters are also increased. In addition, slew rate control is usually used to prevent noise from generating, and some slew rate requirements are between 55V/us and 65V/us. However, by adjustment of the parameters of the drive circuit and the output switches, it is difficult to linearly and accurately adjust the slew rate in a small range.

Therefore, providing a motor driving circuit that can linearly control the slew rate of the output current is an important issue in the industry.

SUMMARY

In order to achieve the above purposes, a heat compress system with a wireless charging function is provided in the present disclosure. The heat compress system with a wireless charging function includes a heat compress device with a wireless charging function and a wireless charging station. The heat compress device with a wireless charging function includes a first processing module, a receiving resonator, electrically connected to the first processing module, and at least one heating module, electrically connected to the first processing module and the receiving resonator. The wireless charging station includes a transmitting resonator for providing a wireless power to the heat compress device with a wireless charging function. The receiving resonator receives the wireless power transmitted by the transmitting resonator of the wireless charging station, and transfers the wireless power to the at least one heating module for heat generation. The first processing module adjusts a temperature of the heating module.

In order to achieve the above purposes, a heat compress device with a wireless charging function is further provided in the present disclosure. The wireless charging function includes a first processing module, a receiving a resonator receiving a wireless power from a wireless charging station and being electrically connected to the first processing module, and at least one heating module electrically connected to the first processing module and the receiving resonator. The first processing module adjusts a temperature of the at least one heating module.

According to the above, the heat compress system with a wireless charging function of the present disclosure provides the wireless power without the need for power cords. The heat compress system of the present disclosure further stores and records the programmable temperature-timing setting data for different users. When a user re-uses the heat compress system, the heat compress system immediately recalls all of the temperature-timing setting data for the user, so that they need not be set again. The heat compress system can also adjust the temperature and the timing of the heat compress device based on the user's stored records. Therefore, the heat compress system of the present disclosure provides a convenient experience for a user without being restricted by a wire (power cord).

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the present disclosure.

DESCRIPTION OF THE EXEMPLARY EMBODIMENTS

Figure 1:
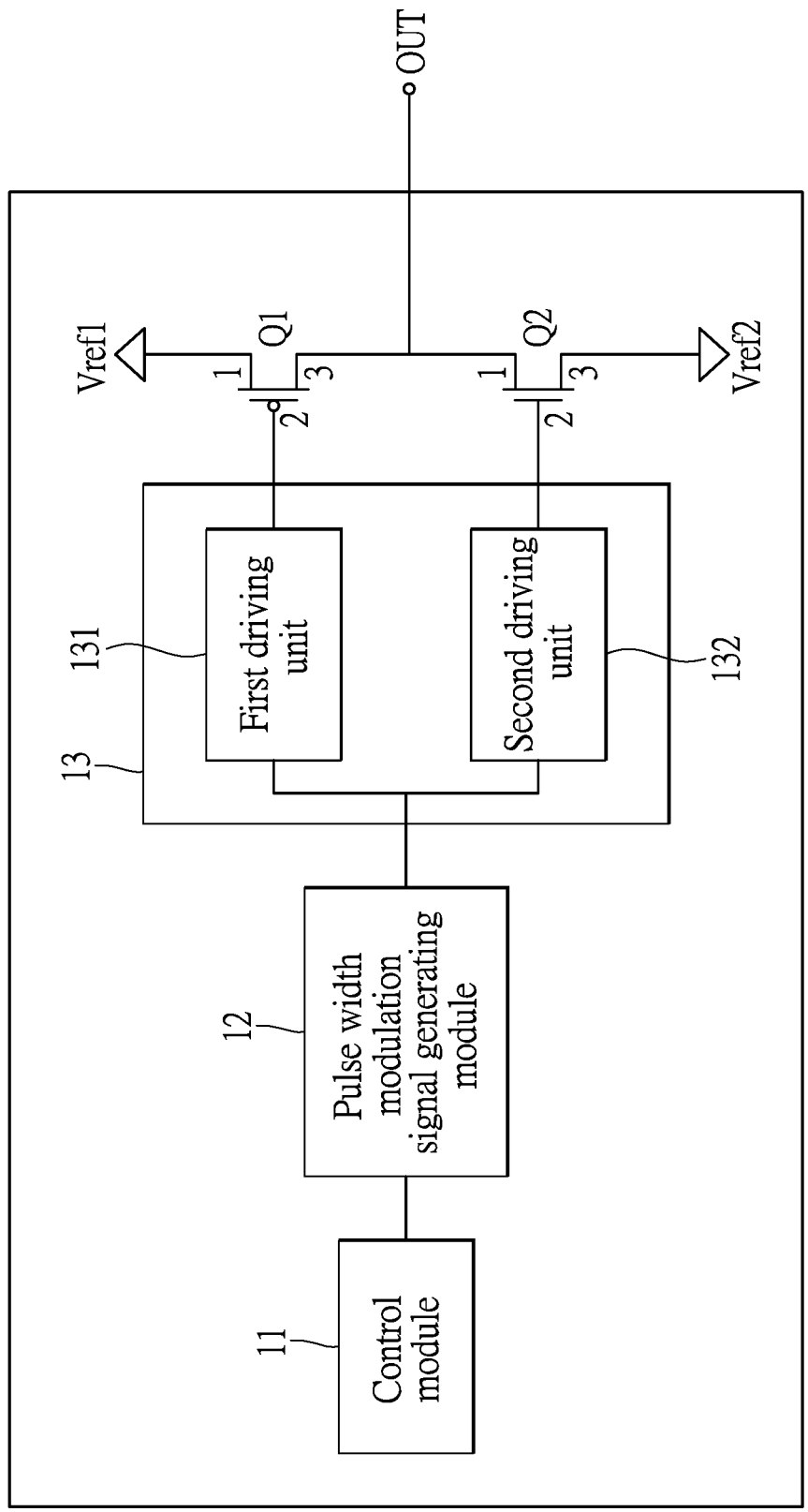
FIG. 1 is a schematic diagram of a motor driving circuit according to an embodiment of the present disclosure.

Reference will now be made in detail to the exemplary embodiments of the instant disclosure, examples of which are illustrated in the accompanying drawings. Wherever possible, the same reference numbers are used in the drawings and the description to refer to the same or like parts.

Figure 2:
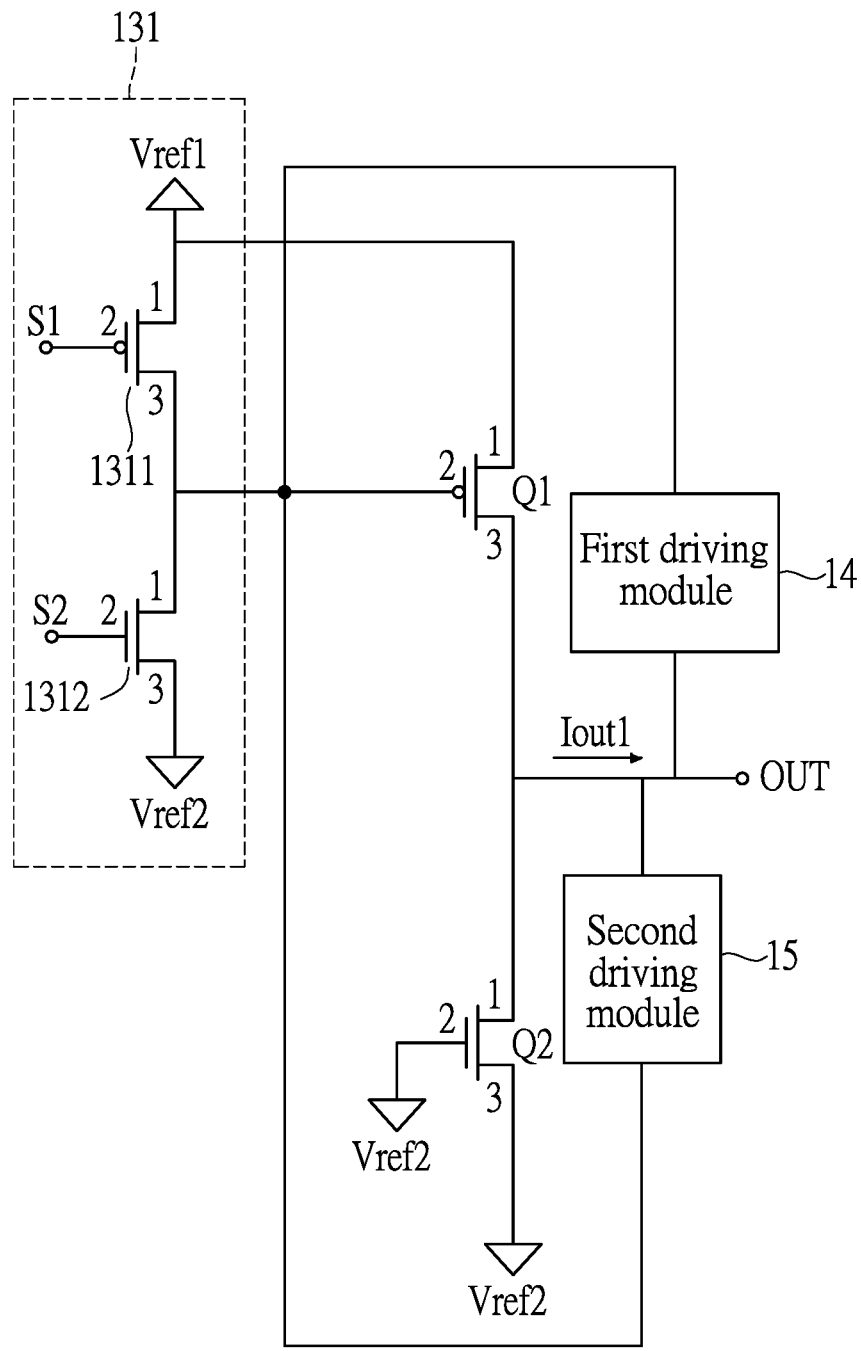
FIG. 2 is a schematic diagram of a part of the motor driving circuit according to the embodiment of the present disclosure.
Figure 3A:
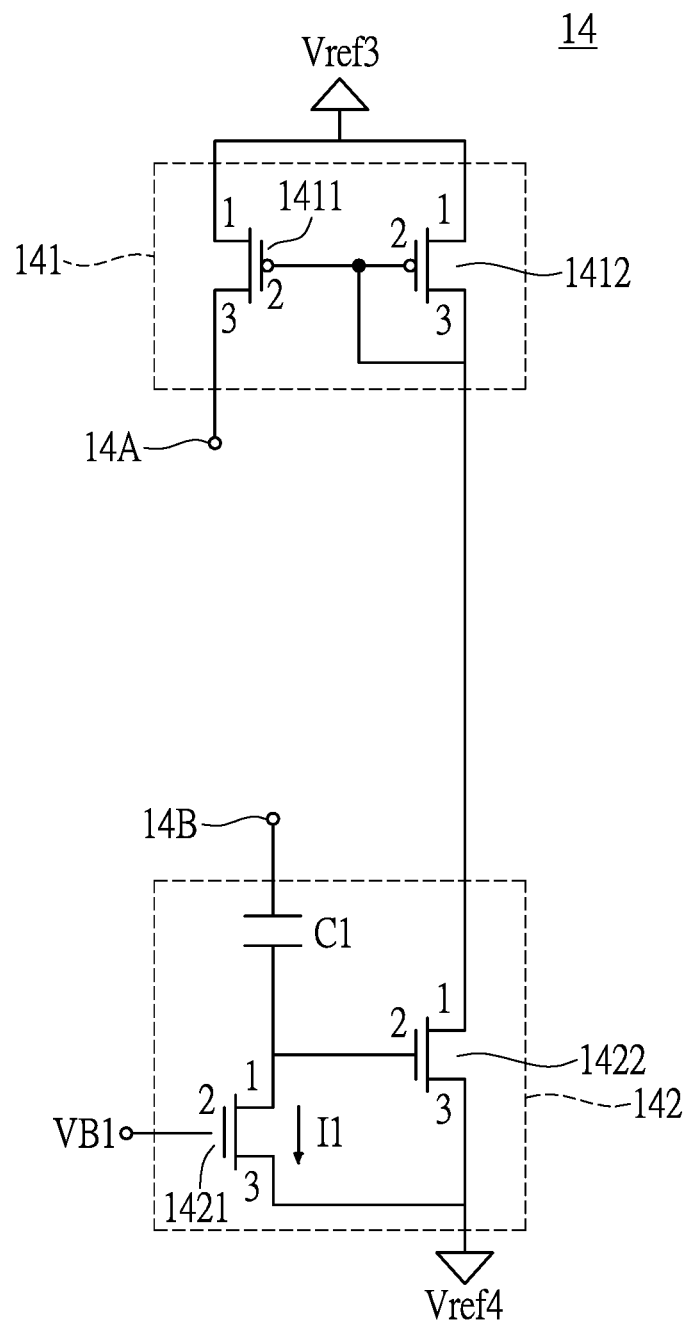
FIG. 3A is a schematic diagram of a first adjusting module according to the embodiment of the present disclosure.
Figure 3B:
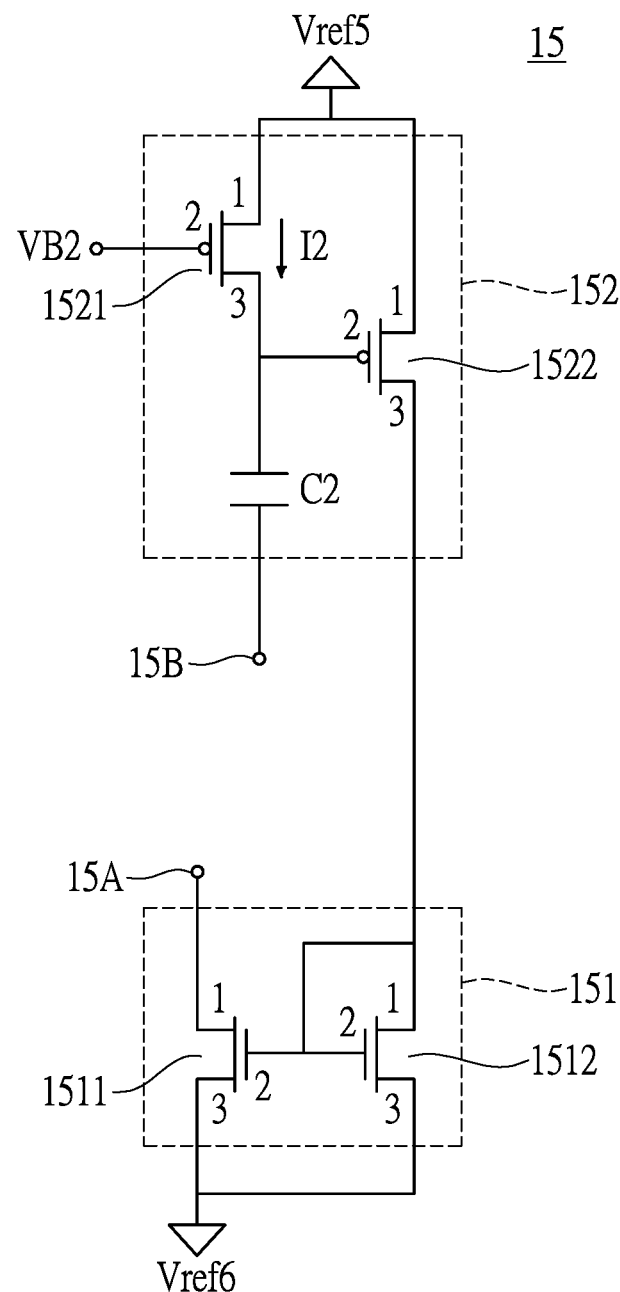
FIG. 3B is a schematic diagram of a second adjusting module according to the embodiment of the present disclosure.
Figure 4:
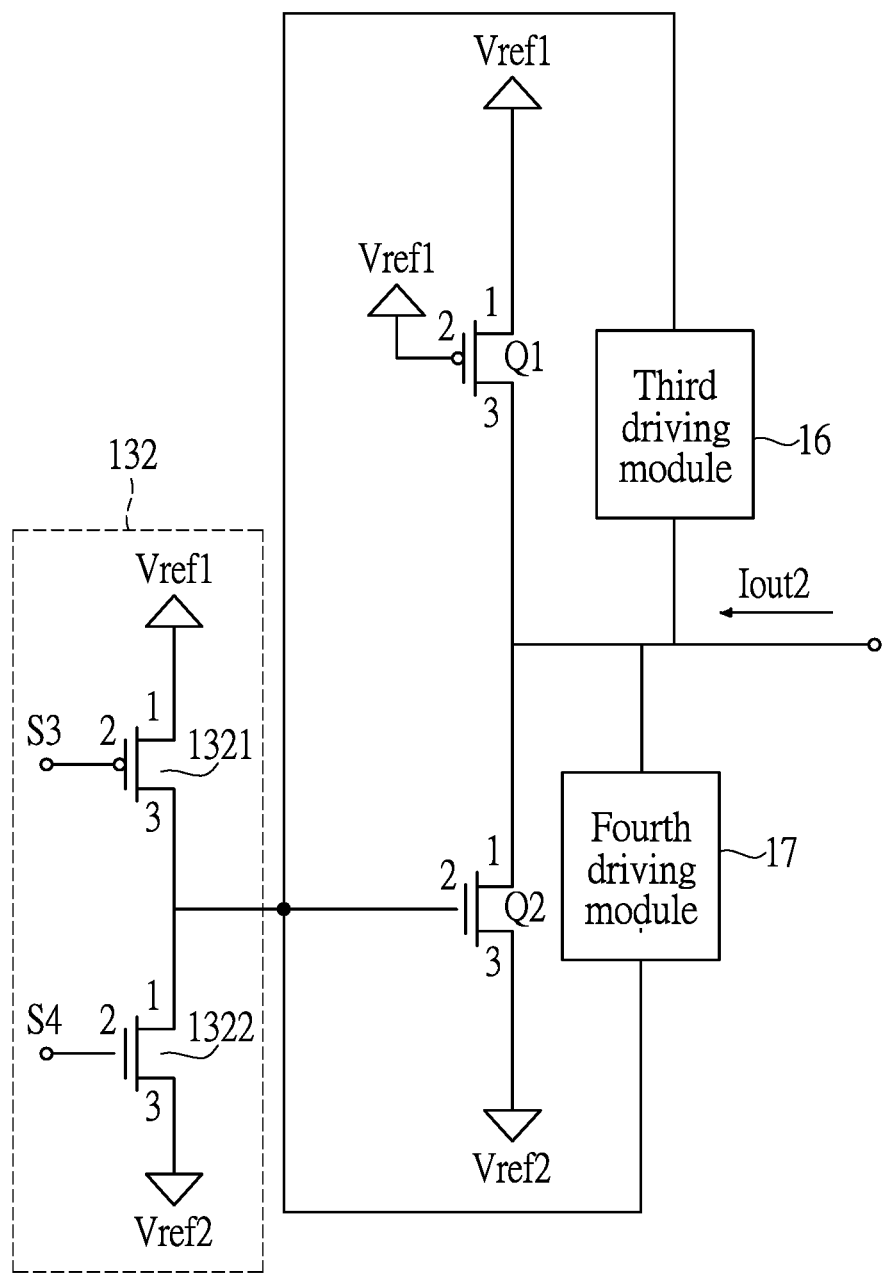
FIG. 4 is a schematic diagram of a part of the motor driving circuit according to the embodiment of the present disclosure.

Referring to FIG. 1, FIG. 2 and FIG. 4, the motor driving circuit 1 includes a control module 11, a pulse width modulation signal generating module 12, a driving module 13, a first output switch Q1, a second output switch Q2, a first adjusting module 14, a second adjusting module 15, a third adjusting module 16, and a fourth adjusting module 17. In the embodiment, the control module 11 is electrically connected to the pulse width modulation signal generating module 12, and the pulse width modulation signal generating module 12 is electrically connected to the driving module 13. The driving module 13 is electrically connected to the first output switch Q1 and the second output switch Q2. The first adjusting module 14 and the second adjusting module 15 are electrically connected to the first output switch Q1. The third adjusting module 16 and the fourth adjusting module 17 are electrically connected to the second output switch Q2.

The motor driving circuit further includes an input module (not shown) for receiving a system control signal, and transmitting the system control signal to the control module 11. The control module 11 transforms the system control signal into a control signal, and transmits the control signal to the pulse width modulation signal generating module 12 for generating at least one pulse width modulation signal to drive the driving module 13. In the embodiment, the driving module 13 includes a first driving unit 131 and a second driving unit 132. The first driving unit 131 is electrically connected to the second end of the first output switch Q1, i.e., the first driving unit 131 is electrically connected to the gate end of the first output switch Q1. The second driving unit 132 is electrically connected to the second end of the second output switch Q2, i.e., the second driving unit 132 is electrically connected to the gate end of the second output switch Q2. In the embodiment, the first end of the first output switch Q1 is electrically connected to a first reference voltage Vref1. The third end of the first output switch is electrically connected to the first end of the second output switch Q2. The third end of the second output switch Q2 is electrically connected to a second reference voltage Vref2. In the embodiment, the motor driving circuit 1 includes an output end OUT. The output end OUT is electrically connected to the third end of the first output switch Q1 and the second end of the second output switch Q2.

In the embodiment, the first reference voltage is a voltage larger than 0V, such as 5V or 12V, but is not limited thereto. The second reference voltage Vref2 is a grounding voltage, and the second reference voltage Vref2 can be −5V in other embodiments of the present disclosure, but is not limited thereto.

In the embodiment, the motor driving circuit 1 provides an output current to drive a motor (not shown) through the output end OUT. In the embodiment, the motor (not shown) is a voice coil motor.

In the embodiment, the first output switch Q1 is a P-type metal oxide semiconductor field effect transistor (P-MOSFET). The second output switch Q2 is an N-type metal oxide semiconductor field effect transistor (N-MOSFET).

In the embodiment, the first driving unit 131 and the second driving unit 132 of the driving module 13 are switching driving circuits. That is to say, when the first driving unit 131 is turned on, the second driving unit 132 is turned off. In other words, when the first driving circuit 131 is turned off, the second driving unit 132 is turned on.

Referring to FIG. 2, in the embodiment, the first driving unit 131 includes a first driving switch 1311 and a second driving switch 1312. A first end of the first driving switch 1311 is electrically connected to the reference voltage Vref1. A second end of the first driving switch 1311 is electrically connected to the pulse width modulation signal generating module 12 for receiving a first driving signal S1, which is a switching driving signal. In other embodiments, the driving signal can be designed differently, and is not limited thereto. A third end of the first driving switch 1311 is electrically connected to the first end of the second driving switch 1312 and the second end of the first output switch Q1. The second end of the second driving switch 1312 is electrically connected to the pulse width modulation signal generating module 12 for receiving a second driving signal S2, which is a switching driving signal. In the embodiment, the first driving signal is an inverse signal of the second driving signal.

The first adjusting module 14 includes a first adjusting end 14A and a second adjusting end 14B. The first adjusting end 14A of the first adjusting module 14 is electrically connected to the second end of the first output switch Q1. The second adjusting end 14B of the first adjusting module 14 is electrically connected to the output end OUT.

The first adjusting module 14 includes a first current mirror unit 141 and a first adjusting unit 142.

The first current unit 141 includes a first current mirror switch 1411 and a second current mirror switch 1412. The first adjusting unit 142 includes a first adjusting capacitor C1, a first adjusting switch 1421 and a second adjusting switch 1422.

The first end of the first current mirror switch 1411 and the first end of the second current mirror switch 1412 are electrically connected to a third reference voltage Vref3. The second end of the first current mirror switch 1411 is electrically connected to the second end and the third end of the second current mirror switch 1412.

The third end of the first current mirror switch is electrically connected to the first adjusting end 14A of the first adjusting module 14. The first adjusting end 14A is electrically connected to the second end of the first output switch Q1. In other words, the third end of the first current mirror switch 1411 is electrically connected to the second end of the first output switch Q1. The second end of the first output switch Q1 is a gate end of the first output switch Q1. The third end of the second current mirror switch 1412 is electrically connected to the first end of the second adjusting switch 1422.

The third end of the first adjusting switch 1421 and the third end of the second adjusting switch 1422 are electrically connected to a fourth reference voltage Vref4. The first end of the first adjusting switch 1421 is electrically connected to the second end of the second adjusting switch 1422.

The second end of the first adjusting switch 1421 is electrically connected to a first bias voltage VB1. The first end of the first adjusting switch 1421 is electrically connected to the second end of the first adjusting capacitor C1. The first end of the first adjusting capacitor C1 is electrically connected to the second adjusting end 14B of the first adjusting module 14. The second adjusting end 14B is electrically connected to the output end OUT of the motor driving circuit 1. In other words, the first end of the first adjusting capacitor C1 is electrically connected to the output end OUT of the motor driving circuit 1.

In the embodiment, the third reference voltage Vref3 is a voltage larger than 0V, such as 5V or 12V but is not limited thereto in the present disclosure. The fourth reference voltage Vref4 is a grounding voltage. The fourth reference voltage Vref4 can be −5V in other embodiments, and is not limited thereto.

In the embodiment, the first current mirror switch 1411 and second current mirror switch 1412 are P-type metal oxide semiconductor field effect transistors (P-MOSFET). The first adjusting switch 1421 and the second adjusting switch 1422 are N-type metal oxide semiconductor field effect transistors (N-MOSFET).

The second adjusting module 15 includes a first adjusting end 15A and a second adjusting end 15B. The first adjusting end 15A of the second adjusting module 15 is electrically connected to the second end of the second output switch 132. The second adjusting end 15B of the second adjusting module 15 is electrically connected to the output end OUT of the motor driving circuit 1.

The second adjusting module 15 includes a second current mirror unit 151 and a second adjusting unit 152.

The second current mirror unit 151 includes a first current mirror switch 1411 and a second current mirror switch 1512. The second adjusting unit 152 includes a second adjusting capacitor C2, a first adjusting switch 1521, and a second adjusting switch 1522.

The third end of the first current mirror switch 1511 and the third end of the second current mirror switch 1512 are electrically connected to a sixth reference voltage Vref6.

The second end of the first current mirror 1511 is electrically connected to the first end and the second end of the second current mirror switch 1512.

The first end of the first current mirror switch 1511 is electrically connected to the first adjusting end 15A of the second adjusting module 15. The first adjusting end 15A is electrically connected to the second end of the second output switch 142. In other words, the first end of the first current mirror switch 1511 is electrically connected to the second end of the second output switch 132, in which the second end of the second output switch is the gate end thereof. The first end of the second output current mirror 1512 is electrically connected to the third end of the second adjusting switch 1522. The first end of the first adjusting switch 1521 and the first end of the second adjusting switch 1522 are electrically connected to a fifth reference voltage Vref5.

In the embodiment, the fifth reference voltage Vref5 is a voltage larger than 0V, such as 5V or 12V but is not limited thereto in the present disclosure. The sixth reference voltage Vref6 is a grounding voltage. The sixth reference voltage Vref6 can be −5V in other embodiments, and is not limited thereto.

The third end of the first adjusting switch 1521 is electrically connected to the second end of the second adjusting switch 1522. The second end of the first adjusting switch 1521 is electrically connected to a second bias voltage VB2. The third end of the first adjusting switch 1521 is electrically connected to a first end of the second adjusting capacitor C2. A second end of the second adjusting capacitor C2 is electrically connected to the second adjusting end 15B of the second adjusting module 15. The second adjusting 15B is electrically connected to the output end OUT of the motor driving circuit 1. In other words, the second end of the second adjusting capacitor C2 is electrically connected to the output end OUT of the motor driving circuit 1.

In the embodiment, the first current mirror switch 1511 and second current mirror switch 1512 are N-type metal oxide semiconductor field effect transistors (N-MOSFET). The first adjusting switch 1521 and the second adjusting switch 1522 are P-type metal oxide semiconductor field effect transistors (P-MOSFET).

In the embodiment, when the driving signal received by the second end of the first output switch Q1 is "On", the first output switch Q1 is turned on, and the second end of the second output switch Q2 is electrically connected to the second reference voltage Vref2. In other words, the second output switch Q2 does not work. The first output current Iout1 flows from the motor driving circuit 1 (first direction), so that the first adjusting module 14 begins to work. In other words, the first adjusting switch 1421 of the first adjusting unit 142 is controlled by the first bias voltage VB1, and a part of the first output current Iout1 flows through the first adjusting capacitor C1 and the first adjusting switch 1421. The current that flows through the first adjusting switch 1421 is a first adjusting current I1. Due to the turning on of the first adjusting switch 1421, the second end (gate end) of the second adjusting switch 1422 has a suitable turning-on voltage for being turned on. In the embodiment, the first bias voltage can be varied according to the practical requirement, and is not limited to that disclosed in the present disclosure.

When the first output current Iout1 is increasing, the first current mirror switch 1411 and the second current unit 1412 of the first current mirror unit 141 synchronously operate according to the second adjusting switch 1422. A coupling current corresponding to the first adjusting current I1 flows through the first adjusting end 14A, such that the voltage of the second end of the first output switch Q1 (gate end) is increased. In the embodiment, the first output switch Q1 is a P-MOSFET. When the voltage of the second end of the first output switch is increased, the voltage difference between the first end and the second end of the first output switch Q1 is reduced, and the turned-on channel of first output switch Q1 is reduced. Therefore, the increasing speed of the first output current Iout1 is limited. In other words, the rising slew rate of the first output current Iout1 is affected by a first adjusting parameter of the first adjusting module 14. The rising slew rate of the first output current Iout1 can be represented by the following equation 1.

$$SRrise = \frac{dIout1}{dt} = \frac{I1}{C1} \qquad \text{equation 1}$$

I1 is the first adjusting current, and C1 is the capacitance of the first adjusting capacitor C1. The ratio of the first adjusting current I1 and the first adjusting capacitor C1 is the first adjusting parameter of the first adjusting module 14.

In the embodiment, when the driving signal received by the second end of the first output switch Q1 is "On", the first output switch Q1 is turned on, and the second end of the second output switch Q2 is electrically connected to the second reference voltage Vref2. In other words, the second output switch Q2 does not work. The first output current Iout1 flows from the motor driving circuit 1 (first direction), so that the second adjusting module 15 begins to work. In other words, the second adjusting switch 1521 of the second adjusting unit 152 is controlled by the second bias voltage VB2, and a part of the first output current Iout1 flows through the second adjusting capacitor C2 and the second adjusting switch 1521. The current that flows through the second adjusting switch 1521 is a second adjusting current I2. Due to the turning on of the first adjusting switch 1521, the second end (gate end) of the second adjusting switch 1522 has a suitable turning on voltage for being turned on. In the embodiment, the first bias voltage can be variable according to the practical request, which is not limited thereto in the present disclosure.

When the first output current Iout1 is decreasing, the first current mirror switch 1411 and the second current unit 1412 of the first current mirror unit 141 synchronously operate according to the second adjusting switch 1422. A coupling current corresponding to the first adjusting current I1 flows through the first adjusting end 14A, such that the voltage of the second end of the first output switch Q1 (gate end) is increased. In the embodiment, the first output switch Q1 is a P-MOSFET. When the voltage of the second end of the first output switch is increased, the voltage difference between the first end and the second end of the first output switch Q1 is reduced, and the turned-on channel of first output switch Q1 is reduced. Therefore, the increasing speed of the first output current Iout1 is limited. In other words, the rising slew rate of the first output current Iout1 is affected by a first adjusting parameter of the first adjusting module 14.

The rising slew rate of the first output current Iout1 can be represented by the following equation 2.

$$SRfall = \frac{dIout1}{dt} = \frac{I2}{C2} \quad \text{equation 2}$$

I2 is the second adjusting current, and C2 is the capacitance of the second adjusting capacitor C2. The ratio of the second adjusting current I2 and the second adjusting capacitor C2 is the second adjusting parameter of the second adjusting module 15.

Figure 5A:
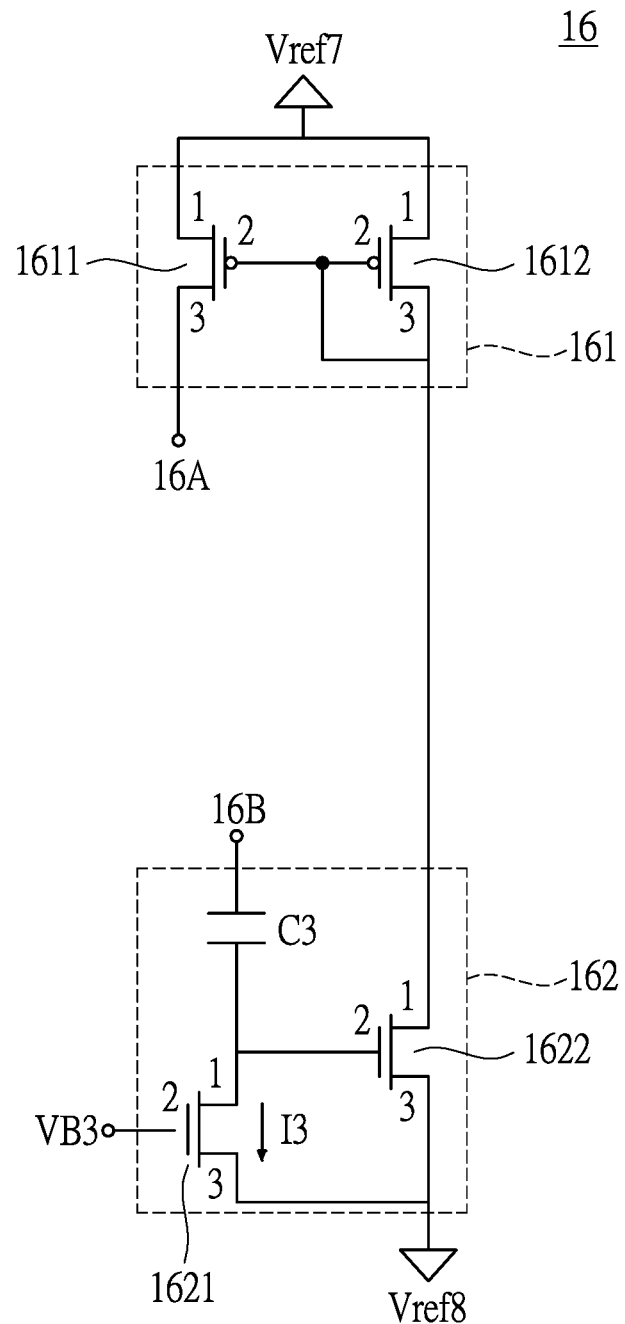
FIG. 5A is a schematic diagram of a third adjusting module according to the embodiment of the present disclosure.
Figure 5B:
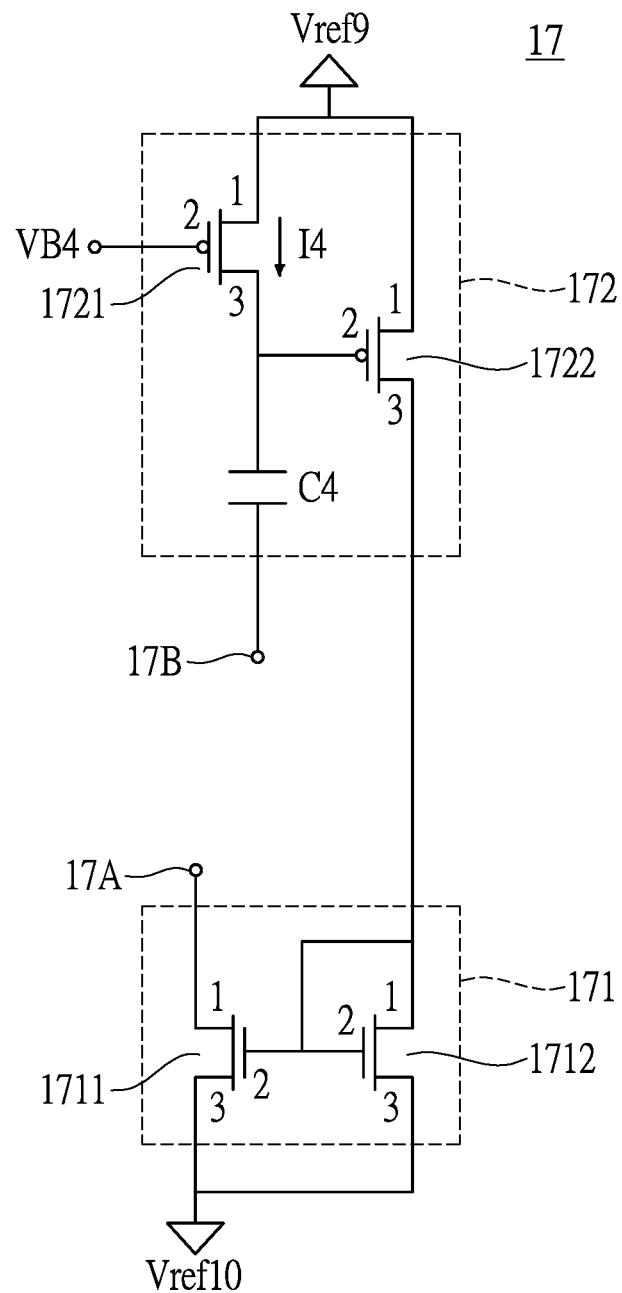
FIG. 5B is a schematic diagram of a fourth adjusting module according to the embodiment of the present disclosure.

Referring to FIG. 4, FIG. 5A and FIG. 5B, in the embodiment, the second driving unit 132 includes a first driving switch 1321 and a second driving switch 1322. A first end of the first driving switch 1321 is electrically connected to the reference voltage Vref1. A second end of the first driving switch 1321 is electrically connected to the pulse width modulation signal generating module 12 for receiving a third driving signal S3, which is a switching driving signal. In other embodiments, the diving signal can be designed differently, and is not limited thereto. A third end of the first driving switch 1321 is electrically connected to the first end of the second driving switch 1322 and the second end of the first output switch Q2. The second end of the second driving switch 1322 is electrically connected to the pulse width modulation signal generating module 12 for receiving a fourth driving signal S4, which is a switching driving signal. In the embodiment, the third driving signal is an inverse signal of the fourth driving signal.

The third adjusting module 16 includes a first adjusting end 16A and a second adjusting end 16B. The first adjusting end 16A of the third adjusting module 16 is electrically connected to the second end of the second output switch Q2. The second adjusting end 16B of the third adjusting module 16 is electrically connected to the output end OUT.

The third adjusting module 16 includes a third current mirror unit 161 and a third adjusting unit 162.

The third current unit 161 includes a first current mirror switch 1611 and a second current mirror switch 1612. The first adjusting unit 162 includes a third adjusting capacitor C3, a first adjusting switch 1621 and a second adjusting switch 1622.

The first end of the first current mirror switch 1611 and the first end of the second current mirror switch 1612 are electrically connected to a seventh reference voltage Vref7. The second end of the first current mirror switch 1611 is electrically connected to the second end and the third end of the second current mirror switch 1612.

The third end of the first current mirror switch 1611 is electrically connected to the third adjusting end 16A of the third adjusting module 16. The first adjusting end 16A is electrically connected to the second end of the second output switch Q2. In other words, the third end of the first current mirror switch 1611 is electrically connected to the second end of the first output switch Q1. The second end of the second output switch Q2 is a gate end of the second output switch Q2. The third end of the second current mirror switch 1612 is electrically connected to the first end of the second adjusting switch 1622.

The third end of the first adjusting switch 1621 and the third end of the second adjusting switch 1622 are electrically connected to an eighth reference voltage Vref8. The first end of the first adjusting switch 1621 is electrically connected to the second end of the second adjusting switch 1622.

The second end of the first adjusting switch 1621 is electrically connected to a third bias voltage VB3. The first end of the first adjusting switch 1621 is electrically connected to the second end of the third adjusting capacitor C3. The first end of the third adjusting capacitor C3 is electrically connected to the second adjusting and 16B of the third adjusting module 16. The second adjusting end 16B is electrically connected to the output end OUT of the motor driving circuit 1. In other words, the first end of the third adjusting capacitor C3 is electrically connected to the output end OUT of the motor driving circuit 1. In the embodiment, the third bias voltage can be designed according to the practical requirement, and is not limited to that disclosed in the present disclosure.

In the embodiment, the seventh reference voltage Vref7 is a voltage larger than 0V, such as 5V or 12V but is not limited thereto in the present disclosure. The eighth reference voltage Vref8 is a grounding voltage. The eighth reference voltage Vref8 can be −5V in other embodiments, and is not limited thereto.

In the embodiment, the first current mirror switch 1611 and second current mirror switch 1612 are P-type metal oxide semiconductor field effect transistors (P-MOSFET). The first adjusting switch 1621 and the second adjusting switch 1622 are N-type metal oxide semiconductor field effect transistors (N-MOSFET).

The fourth adjusting module 17 includes a first adjusting end 17A and a second adjusting end 17B. The first adjusting end 17A of the fourth adjusting module 17 is electrically connected to the second end of the second output switch Q2. The second adjusting end 17B of the fourth adjusting module 17 is electrically connected to the output end OUT of the motor driving circuit 1.

The fourth adjusting module 17 includes a fourth current mirror unit 171 and a fourth adjusting unit 172.

The fourth current mirror unit 171 includes a first current mirror switch 1711 and a second current mirror switch 1712. The second adjusting unit 172 includes a fourth adjusting capacitor C4, a first adjusting switch 1721, and a second adjusting switch 1722.

The third end of the first current mirror switch 1711 and the third end of the second current mirror switch 1712 are electrically connected to a tenth reference voltage Vref10.

The second end of the first current mirror 1711 is electrically connected to the first end and the second end of the second current mirror switch 1712.

The first end of the first current mirror switch 1711 is electrically connected to the first adjusting end 17A of the fourth adjusting module 17. The first adjusting end 17A is electrically connected to the second end of the second output switch Q2. In other words, the first end of the first current mirror switch 1711 is electrically connected to the second end of the second output switch Q2, in which the second end of the second output switch Q2 is the gate end thereof. The first end of the second output current mirror 1712 is electrically connected to the third end of the second adjusting switch 1722. The first end of the first adjusting switch 1721 and the first end of the second adjusting switch 1722 are electrically connected to a ninth reference voltage Vref9.

In the embodiment, the ninth reference voltage Vref9 is a voltage larger than 0V, such as 5V or 12V but is not limited thereto in the present disclosure. The tenth reference voltage Vref10 is a grounding voltage. The tenth reference voltage Vref10 can be −5V in other embodiments, and is not limited thereto.

The third end of the first adjusting switch 1721 is electrically connected to the second end of the second adjusting switch 1722. The second end of the first adjusting switch 1721 is electrically connected to a fourth bias voltage VB4. The third end of the first adjusting switch 1721 is electrically connected to a first end of the fourth adjusting capacitor C4. A second end of the fourth adjusting capacitor C4 is electrically connected to the second adjusting end 17B of the fourth adjusting module 17. The second adjusting 17B is electrically connected to the output end OUT of the motor driving circuit 1. In other words, the second end of the fourth adjusting capacitor C4 is electrically connected to the output end OUT of the motor driving circuit 1. In the embodiment, the fourth bias voltage can be designed according to the practical requirement, and is not limited to that disclosed in the present disclosure.

In the embodiment, the first current mirror switch 1711 and second current mirror switch 1712 are N-type metal oxide semiconductor field effect transistors (N-MOSFET). The first adjusting switch 1721 and the second adjusting switch 1722 are P-type metal oxide semiconductor field effect transistors (P-MOSFET).

In the embodiment, when the driving signal received by the second end of the second output switch Q2 is "On", the second output switch Q2 is turned on, and the second end of the first output switch Q1 is electrically connected to the second reference voltage Vref1. In other words, the first output switch Q1 does not work. The second output current Iout2 flows from the motor driving circuit 1 (first direction), so that the third adjusting module 16 begins to work. In other words, the first adjusting switch 1621 of the first adjusting unit 162 is controlled by the first bias voltage VB3, and a part of the first output current Iout1 flows through the third adjusting capacitor C3 and the first adjusting switch 1621. The current that flows through the first adjusting switch 1621 is a third adjusting current I3. Due to the turning on of the first adjusting switch 1621, the second end (gate end) of the second adjusting switch 1622 has a suitable turning-on voltage for being turned on.

When the second output current Iout2 is increasing, the first current mirror switch 1611 and the second current unit 1612 of the first current mirror unit 161 synchronously operate according to the second adjusting switch 1622. A coupling current corresponding to the third adjusting current I3 flows through the first adjusting end 16A, such that the voltage of the second end of the second output switch Q2 (gate end) is increased. In the embodiment, the second output switch Q2 is an N-MOSFET. When the voltage of the second end of the second output switch Q2 is increased, the voltage difference between the third end and the second end of the first output switch Q1 is reduced, and the turned-on channel of second output switch Q2 is reduced. Therefore, the increasing speed of the first output current Iout1 is limited. In other words, the rising slew rate of the first output current Iout1 is affected by a first adjusting parameter of the first adjusting module 14. The rising slew rate of the first output current Iout1 can be represented by the following equation 3.

$$SRrise = \frac{dIout2}{dt} = \frac{I3}{C3} \qquad \text{equation 3}$$

I3 is the third adjusting current, and C3 is the capacitance of the third adjusting capacitor C3. The ratio of the third adjusting current I3 and the third adjusting capacitor C3 is the third adjusting parameter of the third adjusting module 16.

In the embodiment, when the driving signal received by the second end of the second output switch Q2 is "On," the second output switch Q2 is turned on, and the second end of the first output switch Q1 is electrically connected to the first reference voltage Vref1. In other words, the first output switch Q1 does not work. The second output current Iout2 flows from the motor driving circuit 1 (second direction), so that the fourth adjusting module 17 begins to work. In other words, the first adjusting switch 1721 of the second adjusting unit 172 is controlled by the fourth bias voltage VB4, and a part of the second output current Iout2 flows through the fourth adjusting capacitor C4 and the first adjusting switch 1721. The current that flows through the first adjusting switch 1721 is a fourth adjusting current I4. Due to the turning on of the first adjusting switch 1721, the second end (gate end) of the second adjusting switch 1722 has a suitable turning-on voltage for being turned on.

When the second output current Iout2 is decreasing, the first current mirror switch 1711 and the second current unit 1412 of the first current mirror unit 171 synchronously operate according to the second adjusting switch 1722. A coupling current corresponding to the fourth adjusting current I4 flows through the first adjusting end 17A, such that the voltage of the second end of the second output switch Q2 (gate end) is increased. In the embodiment, the second output switch Q2 is a N-MOSFET. When the voltage of the second end of the first output switch is increased, the voltage difference between the third end and the second end of the second output switch Q2 is reduced, and the turned-on channel of second output switch Q2 is reduced. Therefore, the increasing speed of the second output current Iout1 is limited. In other words, the rising slew rate of the first output current Iout1 is affected by a fourth adjusting parameter of the fourth adjusting module 17. The rising slew rate of the first output current Iout1 can be represented by the following equation 4.

$$SRfall = \frac{dIout2}{dt} = \frac{I4}{C4} \qquad \text{equation 4}$$

I4 is the fourth adjusting current, and C4 is the capacitance of the second adjusting capacitor C4. The ratio of the fourth adjusting current I4 and the fourth adjusting capacitor C4 is the fourth adjusting parameter of the fourth adjusting module 17.

Figure 6:
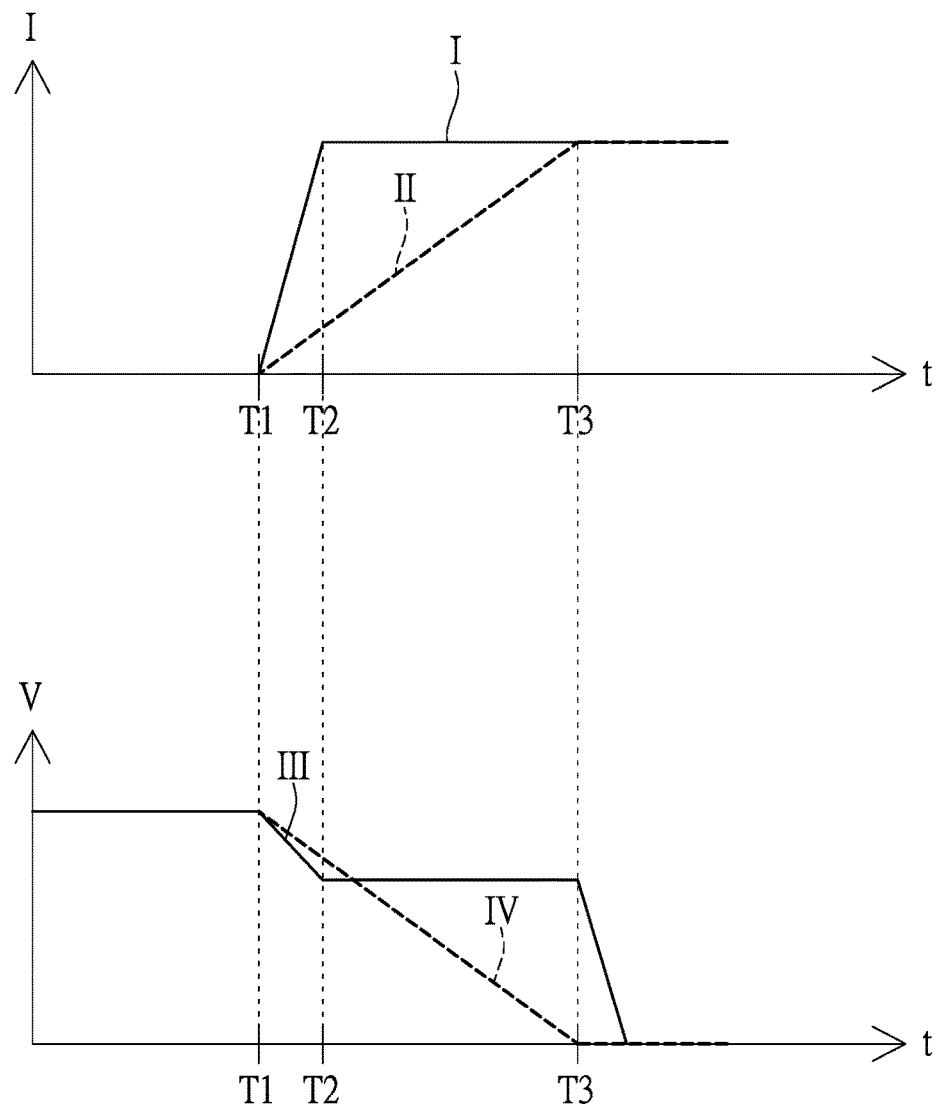
FIG. 6 is a schematic diagram that the voltage-current chart of the first output switch and the output end of the motor driving circuit.

Referring to FIG. 6, the upper side of the FIG. 6 is an output current-time chart, and the lower side of the FIG. 6 is a chart that shows the voltage of second end of the first output switch Q1. The solid line I is the output current of the motor driving circuit without adjusting modules. The dotted line II is the output current of the motor driving circuit with adjusting modules. The solid line III shows the voltage of the second end of the first output switch Q1 without adjusting modules. The dotted line IV shows the voltage of the second end of the first output switch Q1 of the motor driving circuit with adjusting modules.

In the first time T1 of the solid line I in FIG. 6, the current curve starts to rise with a large rising slew rate and the motor driving circuit generates a loud noise. In the second time T2 of the solid line I, the current achieves a predetermined value. However, in the dotted line III, the current curve slowly increases until reaching a predetermined value at the third time T3.

In contrast, when the motor driving circuit does not include any adjusting module, the voltage of the second end of the first output switch Q1 is shown as the solid line III in FIG. 6. When the motor driving circuit includes adjusting modules, the voltage of the second end of the first output switch Q1 is shown as the dotted line IV.

According to the above, in the switching motor driving circuit of the present disclosure, both of the first output switch and the second switch include two adjusting modules. Regardless of the direction of the output current, the rising slew rate and the falling slew rate can be linearly adjusted. In addition, the circuit of the adjusting module is simple and separate from the original driving circuit. Accordingly, the parameters of the original driving circuit are not affected, and the rising slew rate and the falling slew rate can be effectively adjusted. In addition, the process yield can be improved, the costs can be reduced, and the developmental schedule can be shortened.

The above-mentioned descriptions represent merely the exemplary embodiments of the instant disclosure, without any intention to limit the scope of the instant disclosure thereto. Various equivalent changes, alterations or modifications based on the claims of present disclosure are all consequently viewed as being embraced by the scope of the instant disclosure.

What is claimed is:

1. A motor driving circuit, including an output end for outputting a first output current along a first direction and a second output current along a second direction to drive a motor, the motor driving circuit comprising: a driving module providing a switching driving signal; a first output switch including a first end, a second end and a third end, the first end of the first output switch being electrically connected to a first reference voltage, the third end of the first output switch being electrically connected to the output end of the motor driving circuit, wherein the second end of the first output switch receives a switching driving signal of the driving module;
    a second output switch including a first end, a second end and a third end, the first end of the second output switch being electrically connected to the third end of the first output switch and the output end of the motor driving circuit, the third end of the second output switch being electrically connected to a second reference voltage, wherein the second end of the second output switch receives the switching driving signal of the driving module;
    a first adjusting module including a first adjusting end and a second adjusting end, the first adjusting end of the first adjusting module being electrically connected to the second end of the first output switch, the second adjusting end of the first adjusting module being electrically connected to the output end of the motor driving circuit, wherein the first adjusting module has a first adjusting parameter; and
    a second adjusting module including a first adjusting end and a second adjusting end, the first adjusting end being electrically connected to the second end of the first output switch, the second adjusting end of the second adjusting module being electrically connected to the output end of the motor driving circuit, wherein the second adjusting module has a second adjusting parameter;
    wherein a rising slew rate of the first output current along the first direction is adjusted according to the first adjusting parameter of the first adjusting module, a falling slew rate of the first output current along the first direction is adjusted according to the second adjusting parameter of the second adjusting module;
    wherein the first adjusting module includes: a first current mirror unit, including:
    a first current mirror switch having a first end, a second end and a third end, the first end of the first current mirror switch being electrically connected to a third reference voltage; and a second current mirror switch having a first end, a second end and a third end, the first end of the second current mirror switch being electrically connected to the third reference voltage; and a first adjusting unit, including:
    a first adjusting capacitor having a first end and a second end; a first adjusting switch having a first end, a second end and a third end; and
    a second adjusting switch having a first end, a second end and a third end, wherein the third end of the first adjusting switch and the third end of the second adjusting switch are electrically connected to a fourth reference voltage;
    wherein the second end of the first current mirror switch is electrically connected to the second end and the third end of the second current mirror switch, the third end of the first current mirror switch is electrically connected to the first adjusting end of the first adjusting module, the third end of the second current mirror switch is electrically connected to the first end of the second adjusting switch, the first end of the first adjusting switch is electrically connected to the second end of the second adjusting switch, the first end of the first adjusting switch is electrically connected to the second end of the first adjusting capacitor, and the first end of the first adjusting capacitor is electrically connected to the second adjusting end of the first adjusting module.

2. The motor driving circuit of claim 1, wherein the first adjusting module and the second adjusting module adjust a voltage of the second end of the first output switch based on the first output current along the first direction for adjusting the rising slew rate or the falling slew rate of the first output current.

3. The motor driving circuit of claim 1, wherein a linear adjustment of the rising slew rate of the first output current along the first direction is adjusted based on the first adjusting parameter of the first adjusting module, and a linear adjustment of the falling slew rate of the first output current along the first direction is adjusted based on the second adjusting parameter of the second adjusting module.

4. The motor driving circuit of claim 3, wherein the first adjusting parameter is determined based on a first adjusting current flowing through the first adjusting switch of the first adjusting module and a capacitance of the first adjusting capacitor.

5. The motor driving circuit of claim 2, wherein the second adjusting module includes:
    a second current mirror unit, including:
    a first current mirror switch having a first end, a second end and a third end, the third end of the first current mirror switch being electrically connected to a sixth reference voltage; and
    a second current mirror switch having a first end, a second end and a third end, the third end of the second current mirror switch being electrically connected to the sixth reference voltage; and
    a second adjusting unit, including:
    a second adjusting capacitor having a first end and a second end;
    a first adjusting switch having a first end, a second end and a third end; and a second adjusting switch having a first end, a second end and a third end, wherein the first end of the first adjusting switch and the first end of the second adjusting switch are electrically connected to a fifth reference voltage;

wherein the second end of the first current mirror switch is electrically connected to the second end and the first end of the second current mirror switch, the first end of the first current mirror switch is electrically connected to the first adjusting end of the second adjusting module, the first end of the second current mirror switch is electrically connected to the third end of the second adjusting switch, the third end of the first adjusting switch is electrically connected to the second end of the second adjusting switch, the second end of the first adjusting switch is electrically connected to a second bias voltage, the third end of the first adjusting switch is electrically connected to the first end of the second adjusting capacitor, and the second end of the second adjusting capacitor is electrically connected to the second adjusting end of the second adjusting module.

6. The motor driving circuit of claim 4, wherein the second adjusting parameter is determined based on a second adjusting current flowing through the first adjusting switch of the second adjusting module and a capacitance of the second adjusting capacitor.

7. The motor driving circuit of claim 1, further comprising:
a third adjusting module, including a first adjusting end and a second adjusting end, the first adjusting end of the third adjusting module being electrically connected to the second end of the second output switch, the second adjusting end of the third adjusting module being electrically connected to the output end of the motor driving circuit, wherein the third adjusting module has a third adjusting parameter; and
a fourth adjusting module including a first adjusting end and a second adjusting end, the first adjusting end of the fourth adjusting module being electrically connected to the second end of the second output switch, the second adjusting end of the fourth adjusting module being electrically connected to the output end of the motor driving circuit, wherein the fourth adjusting module has a fourth adjusting parameter;
wherein a rising slew rate of the first output current along a second direction is adjusted based on the third adjusting parameter, a falling slew rate of the first output current along the second direction is adjusted based on the fourth adjusting parameter.

8. The motor driving circuit of claim 7, wherein the third adjusting module and the fourth adjusting module adjust a voltage of the second end of the second output switch based on the second output current along the second direction for adjusting the rising slew rate or the falling slew rate of the second output current.

9. The motor driving circuit of claim 7, wherein a linear adjustment of the rising slew rate of the second output current along the second direction is adjusted based on the third adjusting parameter, a linear adjustment of the falling slew rate of the second output current along the second direction is adjusted based on the fourth parameter of the fourth adjusting module.

10. The motor driving circuit of claim 7, wherein the third adjusting module includes:
a third current mirror unit, including:
a first current mirror switch having a first end, a second end and a third end, the first end of the first current mirror switch being electrically connected to a seventh reference voltage; and
a second current mirror switch having a first end, a second end and a third end, the first end of the second current mirror switch being electrically connected to the seventh reference voltage; and
a third adjusting unit, including:
a third adjusting capacitor having a first end and a second end;
a first adjusting switch having a first end, a second end and a third end; and
a second adjusting switch having a first end, a second end and a third end, wherein the third end of the first adjusting switch and the third end of the second adjusting switch are electrically connected to an eighth reference voltage;
wherein the second end of the first current mirror switch is electrically connected to the second end and the third end of the second current mirror switch, the third end of the first current mirror switch is electrically connected to the first adjusting end of the third adjusting module, the third end of the second current mirror switch is electrically connected to the first end of the second adjusting switch, the first end of the first adjusting switch is electrically connected to the second end of the second adjusting switch, the second end of the first adjusting switch is electrically connected to a third reference voltage, the first end of the first adjusting switch is electrically connected to the second end of the third adjusting capacitor, and the first end of the third adjusting capacitor is electrically connected to the second adjusting end of the third adjusting module.

11. The motor driving circuit of claim 10, wherein the fourth adjusting module includes:
a fourth current mirror unit, including:
a first current mirror switch having a first end, a second end and a third end, the third end of the first current mirror switch being electrically connected to a tenth reference voltage; and
a second current mirror switch having a first end, a second end and a third end, the third end of the second current mirror switch being electrically connected to the tenth reference voltage; and
a fourth adjusting unit, including:
a fourth adjusting capacitor having a first end and a second end;
a first adjusting switch having a first end, a second end and a third end; and
a second adjusting switch having a first end, a second end and a third end,
wherein the first end of the first adjusting switch and the first end of the second adjusting switch are electrically connected to a ninth reference voltage;
wherein the second end of the first current mirror switch is electrically connected to the second end and the first end of the second current mirror switch, the first end of the first current mirror switch is electrically connected to the first adjusting end of the fourth adjusting module, the first end of the second current mirror switch is electrically connected to the third end of the second adjusting switch, the third end of the first adjusting switch is electrically connected to the second end of the second adjusting switch, the second end of the first adjusting switch is electrically connected to a fourth bias voltage, the third end of the first adjusting switch is electrically connected to the first end of the fourth adjusting capacitor, and the second end of the fourth adjusting capacitor is electrically connected to the second adjusting end of the fourth adjusting module.

12. The motor driving circuit of claim 1, further comprising:
   a control module generating a control signal based on a system control signal; and
   a pulse width modulation signal generating module electrically connected to the control module and the driving module, generating a pulse width modulation signal based on the control signal, and transmitting the pulse width modulation signal to the driving module for driving the first output switch and the second output switch.

13. The motor driving circuit of claim 11, wherein the driving module includes:
   a first driving unit; and
   a second driving unit, wherein the first driving unit is electrically connected to the second end of the first output switch, and the second driving unit is electrically connected to the second end of the second output switch.

14. A motor driving circuit, including an output end for outputting a first output current along a first direction and a second output current along a second direction to drive a motor, the motor driving circuit comprising: a driving module providing a switching driving signal;
   a first output switch including a first end, a second end and a third end, the first end of the first output switch being electrically connected to a first reference voltage, the third end of the first output switch being electrically connected to the output end of the motor driving circuit, wherein the second end of the first output switch receives a switching driving signal of the driving module; a second output switch including a first end, a second end and a third end, the first end of the second output switch being electrically connected to the third end of the first output switch and the output end of the motor driving circuit, the third end of the second output switch being electrically connected to a second reference voltage, wherein the second end of the second output switch receives the switching driving signal of the driving module; a first adjusting module including a first adjusting end and a second adjusting end, the first adjusting end of the first adjusting module being electrically connected to the second end of the first output switch, the second adjusting end of the first adjusting module being electrically connected to the output end of the motor driving circuit, wherein the first adjusting module has a first adjusting parameter; and
   a second adjusting module including a first adjusting end and a second adjusting end, the first adjusting end being electrically connected to the second end of the first output switch, the second adjusting end of the second adjusting module being electrically connected to the output end of the motor driving circuit, wherein the second adjusting module has a second adjusting parameter; a third adjusting module including a first adjusting end and a second adjusting end, the first adjusting end of the third adjusting module being electrically connected to the second end of the second output switch, the second adjusting end of the third adjusting module being electrically connected to the output end of the motor driving circuit, wherein the third adjusting module has a third adjusting parameter; and
   a fourth adjusting module including a first adjusting end and a second adjusting end, the first adjusting end of the fourth adjusting module being electrically connected to the second end of the second output switch, the second adjusting end of the fourth adjusting module being electrically connected to the output end of the motor driving circuit, wherein the fourth adjusting module has a fourth adjusting parameter;
   wherein a rising slew rate of the first output current along the first direction is adjusted according to the first adjusting parameter of the first adjusting module, a falling slew rate of the first output current along the first direction is adjusted according to the second adjusting parameter of the second adjusting module, a rising slew rate of the second output current along the second direction is adjusted according to third adjusting parameter, and a falling slew rate of the second output current along the second direction is adjusted according to the fourth adjusting parameter;
   wherein the first adjusting module includes: a first current mirror unit, including:
   a first current mirror switch having a first end, a second end and a third end, the first end of the first current mirror switch being electrically connected to a third reference voltage; and a second current mirror switch having a first end, a second end and a third end, the first end of the second current mirror switch being electrically connected to the third reference voltage; and a first adjusting unit, including:
   a first adjusting capacitor having a first end and a second end; a first adjusting switch having a first end, a second end and a third end; and
   a second adjusting switch having a first end, a second end and a third end, wherein the third end of the first adjusting switch and the third end of the second adjusting switch are electrically connected to a fourth reference voltage;
   wherein the second end of the first current mirror switch is electrically connected to the second end and the third end of the second current mirror switch, the third end of the first current mirror switch is electrically connected to the first adjusting end of the first adjusting module, the third end of the second current mirror switch is electrically connected to the first end of the second adjusting switch, the first end of the first adjusting switch is electrically connected to the second end of the second adjusting switch, the first end of the first adjusting switch is electrically connected to the second end of the first adjusting capacitor, and the first end of the first adjusting capacitor is electrically connected to the second adjusting end of the first adjusting module.

* * * * *